United States Patent
Ha et al.

(10) Patent No.: US 7,522,649 B2
(45) Date of Patent: Apr. 21, 2009

(54) SUBMOUNT OF A MULTI-BEAM LASER DIODE MODULE

(75) Inventors: Kyoung-ho Ha, Yongin-si (KR);
Tae-hoon Jang, Yongin-si (KR);
Hyung-kun Kim, Yongin-si (KR)

(73) Assignee: Samsung Electronic, Co., Ltd, Gyeonggi-do (KR)

( * ) Notice: Subject to any disclaimer, the term of this patent is extended or adjusted under 35 U.S.C. 154(b) by 123 days.

(21) Appl. No.: 11/808,174

(22) Filed: Jun. 7, 2007

(65) Prior Publication Data
US 2007/0286252 A1 Dec. 13, 2007

(30) Foreign Application Priority Data
Jun. 8, 2006 (KR) ...................... 10-2006-0051462

(51) Int. Cl.
*H01S 5/00* (2006.01)
(52) U.S. Cl. ................................ 372/50.122; 372/50.12
(58) Field of Classification Search ............... 372/50.12, 372/50.122, 68, 107
See application file for complete search history.

(56) References Cited

U.S. PATENT DOCUMENTS 6,444,998 B1    9/2002  Taniguchi et al.

FOREIGN PATENT DOCUMENTS

| JP | 2000-269601 | 9/2000 |
| JP | 2003-031905 | 1/2003 |

*Primary Examiner*—Armando Rodriguez
(74) *Attorney, Agent, or Firm*—Harness, Dickey & Pierce, PLC

(57) ABSTRACT

Example embodiments may provide a submount in to which a multi-beam laser diode may be flip-chip bonded and a multi-beam laser diode module including the submount. The submount may include a first submount and a second submount. The first submount may include a first substrate, a plurality of first solder layers formed on the first substrate corresponding to electrodes of the multi-beam laser diode, and a plurality of via holes that may penetrate the first substrate and may be filled with conductive materials to electrically connect to the first solder layers. The electrodes may be bonded to the first solder layers. The second submount may include a second substrate under the first substrate and a plurality of bonding pads corresponding to the number of electrodes formed on the second substrate to electrically connect to the conductive materials filled in the via holes.

32 Claims, 13 Drawing Sheets

SUBMOUNT OF A MULTI-BEAM LASER DIODE MODULE

PRIORITY STATEMENT

This application claims the benefit of Korean Patent Application No. 10-2006-0051462, filed on Jun. 8, 2006, in the Korean Intellectual Property Office, the disclosure of which is incorporated herein in its entirety by reference.

BACKGROUND

1. Field

Example embodiments may provide a submount and a laser diode module including the submount, for example, to a submount in which a multi-beam laser diode having a plurality of independently driven light emitting units may be flip-chip bonded to the submount and a multi-beam laser diode module including the submount.

2. Description of the Related Art

In general, high-speed printing in a laser printer and data reproduction/recordation in an optical storage device require a multi-beam laser diode having a plurality of independently driven light emitting units.

FIG. 1 is a diagram of a related art multi-beam laser diode 1. As shown in FIG. 1, the multi-beam laser diode 1 may include a plurality of ridges to form a plurality of light emitting units and electrodes $A_1$, $A_2$, $A_3$, and $A_4$ on an upper surface of the ridges. Electrodes $A_1$, $A_2$, $A_3$, and $A_4$ may be covered with a protective layer 9, which may include openings $9W_1$, $9W_2$, $9W_3$, and $9W_4$ that expose electrodes $A_1$, $A_2$, $A_3$, and $A_4$, respectively. The electrodes $A_1$, $A_2$, $A_3$, and $A_4$ may be electrically connected with bonding pads $PD_1$, $PD_2$, $PD_3$, and $PD_4$, respectively, by conductive layers $L_1$, $L_2$, $L_3$, and $L_4$. In such a structure, current may be supplied to each of electrodes $A_1$, $A_2$, $A_3$, and $A_4$ from bonding pads $PD_1$, $PD_2$, $PD_3$, and $PD_4$, allowing a plurality of light emitting units to be independently driven.

In the multi-beam laser diode 1, heat generated from each ridge may be emitted through a substrate 2 on a lower part of each ridge, and thermal cross-talk may occur between adjacent ridges.

In the multi-beam laser diode 1, efficiency of the multi-beam laser diode 1 may decrease in proportion to the number of ridges. Assuming that the efficiency of the multi-beam laser diode 1 having one ridge is P, efficiency of the multi-beam laser diode 1 having n ridges may be decreased to $P^n$. For example, if the efficiency of a multi-beam laser diode with one ridge is 0.5, or 50%, the efficiency of a multi-beam laser diode with 4 ridges may be decreased to $0.5^4$, or 6.25%. In order to prevent reduction of a multi-beam laser diode's efficiency, chip size of a multi-beam laser diode may be reduced and the number of laser diode chips per wafer may be increased. It may be difficult to reduce chip size of the multi-beam laser diode 1 due to bonding pads $PD_1$, $PD_2$, $PD_3$, and $PD_4$.

FIG. 2 shows a related art multi-beam laser diode module, which may overcome the reduced efficiency problem. As shown in FIG. 2, the multi-beam laser diode module may include a laser diode 11 having a plurality of ridges and a submount 44 on which the laser diode 11 may be flip-chip bonded. The laser diode 11 may include electrodes 14 and 21 on a lower surface of ridges of the laser diode 11, and the submount 44 may include bonding pads 45, which may be electrically connected with the electrodes 14 and 21 on an upper surface of the submount 44. Solder layers 46 may be formed on the bonding pads 45 for flip-chip bonding to the electrodes 14 and 21 of the laser diode 11. In the laser diode module shown in FIG. 2, the laser diode 11 may be flip-chip bonded to the submount 44, and heat generated from each of the ridges may be directly transmitted to a heat sink (not illustrated) via the submount 44. Thus, thermal cross-talk may not occur between adjacent ridges. In addition, the large-sized bonding pads 45 may be formed on the submount 44, and chip size of the laser diode 11 may be reduced, thereby increasing efficiency of the laser diode 11. In such a laser diode module, if the laser diode 11 is bonded to the submount 44, the solder layers 46 formed on the submount 44 may protrude at the rear of the laser diode 11 as illustrated in FIG. 3 and a solder "bump" 46' may be formed. The solder bump 46' may obstruct laser light from reaching its outlet through the rear of the laser diode 11, and thus sensitivity of the photo diode 50, which monitors laser light, may be reduced.

SUMMARY

Example embodiments may provide a submount that may reduce the size of a multi-beam laser diode and/or prevent or reduce thermal cross-talk between light emitting units of a laser diode and a laser diode module including the submount.

Example embodiments may provide a submount to which a multi-beam laser diode having a plurality of independently driven light emitting units may be flip-chip bonded. The submount may include a first submount and a second submount. The first submount may have a first substrate, a plurality of first solder layers formed on the first substrate corresponding to electrodes of a multi-beam laser diode, and/or a plurality of via holes formed to penetrate the first substrate and filled with conductive materials to electrically connect to the first solder layers. Electrodes of the laser diode may be bonded to the first solder layers. The second submount may include a second substrate under the first substrate and/or a plurality of bonding pads corresponding to the number of electrodes formed on the second substrate to electrically connect to the conductive materials filled in the via holes.

Example embodiments may provide a multi-beam laser diode module that may include a multi-beam laser diode having a plurality of independently driven light emitting units and a submount to which the multi-beam laser diode may be flip chip bonded. The submount may include a first submount and a second submount. The first submount may have a first substrate, a plurality of first solder layers formed on the first substrate corresponding to electrodes of the multi-beam laser diode, and/or a plurality of via holes formed to penetrate the first substrate and filled with conductive materials to electrically connect to the first solder layers. The electrodes of the laser diode may be bonded to the first solder layers. The second submount may include a second substrate under the first substrate and a plurality of bonding pads corresponding to the number of electrodes formed on the second substrate to electrically connect to the conductive materials filled in the via holes.

Example embodiments may provide a submount to which a multi-beam laser diode having a plurality of independently driven light emitting units may be flip-chip bonded. The submount may include a substrate, a plurality of first solder layers formed on the upper surface of the substrate corresponding to electrodes of the multi-beam laser diode, a plurality of via holes formed to penetrate the substrate and filled with conductive materials to electrically connect to the first solder layers, and/or a plurality of bonding pads corresponding to the number of electrodes formed on the lower surface of the substrate to electrically connect to the conductive materials filled in the via holes. The electrodes of the laser diode may be bonded to the first solder layers.

Example embodiments may provide a multi-beam laser diode module that may include a multi-beam laser diode with a plurality of independently driven light emitting units and a submount to which the multi-beam laser diode may be flip chip bonded. The submount may include a substrate, a plurality of first solder layers formed on the upper surface of the substrate corresponding to electrodes of the multi-beam laser diode, a plurality of via holes formed to penetrate the substrate and filled with conductive materials to electrically connect to the first solder layers, and/or a plurality of bonding pads corresponding to the number of electrodes formed on the lower surface of the substrate to electrically connect to the conductive materials filled in the via holes. The electrodes of the laser diode may be bonded to the first solder layers.

Example embodiments may provide a submount to which a multi-beam laser diode having a plurality of independently driven light emitting units may be flip-chip bonded. The submount may include a substrate, a plurality of conductive layers formed on the substrate to correspond to electrodes of the multi-beam laser diode, a plurality of solder layers formed on the conductive layers, and a plurality of bonding pads formed on the lower surface of the substrate to electrically connect to the conductive layers. The conductive layers may extend along a side of the substrate to the lower surface of the substrate and may be formed on the upper surface of the substrate and may be bonded to the solder layers.

Example embodiments may provide a multi-beam laser diode module that may include a multi-beam laser diode having a plurality of independently driven light emitting units and a submount to which the multi-beam laser diode may be flip chip bonded. The submount may include a substrate, a plurality of conductive layers formed on the substrate to correspond to electrodes of the multi-beam laser diode, a plurality of solder layers formed on the conductive layers, and/or a plurality of bonding pads formed on the lower surface of the substrate to electrically connect to the conductive layers. The conductive layers may extend along a side of the substrate to the lower surface of the substrate and may be formed on the upper surface of the substrate and may be bonded to the solder layers.

Example embodiments may provide a submount to which a multi-beam laser diode having a plurality of independently driven light emitting units may be flip-chip bonded. The submount may include a first submount and a second submount. The first submount may include a first substrate, a plurality of first conductive layers formed on the first substrate to correspond to electrodes of the multi-beam laser diode, and a plurality of solder layers formed on the first conductive layers. The first conductive layers may extend along a side of the substrate and may be formed on the upper surface of the first substrate bonded to the solder layers. The second submount may include a second substrate under the first substrate and a plurality of bonding pads formed on the second substrate to electrically connect to the first conductive layers.

Example embodiments may provide a multi-beam laser diode module that may include a multi-beam laser diode with a plurality of independently driven light emitting units and a submount to which the multi-beam laser diode may be flip chip bonded. The submount may include a first submount and a second submount. The first submount may include a first substrate, a plurality of first conductive layers formed on the first substrate to correspond to electrodes of the multi-beam laser diode, and/or a plurality of solder layers formed on the first conductive layers. The first conductive layers may extend along a side of the substrate and may be formed on the upper surface of the first substrate bonded to the solder layers. The second submount may include a second substrate under the first substrate and a plurality of bonding pads formed on the second substrate to electrically connect to the first conductive layers.

BRIEF DESCRIPTION OF THE DRAWINGS

The above and other features and/or advantages of example embodiments may be more apparent by describing drawings thereof in which.

DETAILED DESCRIPTION

Figure 1:
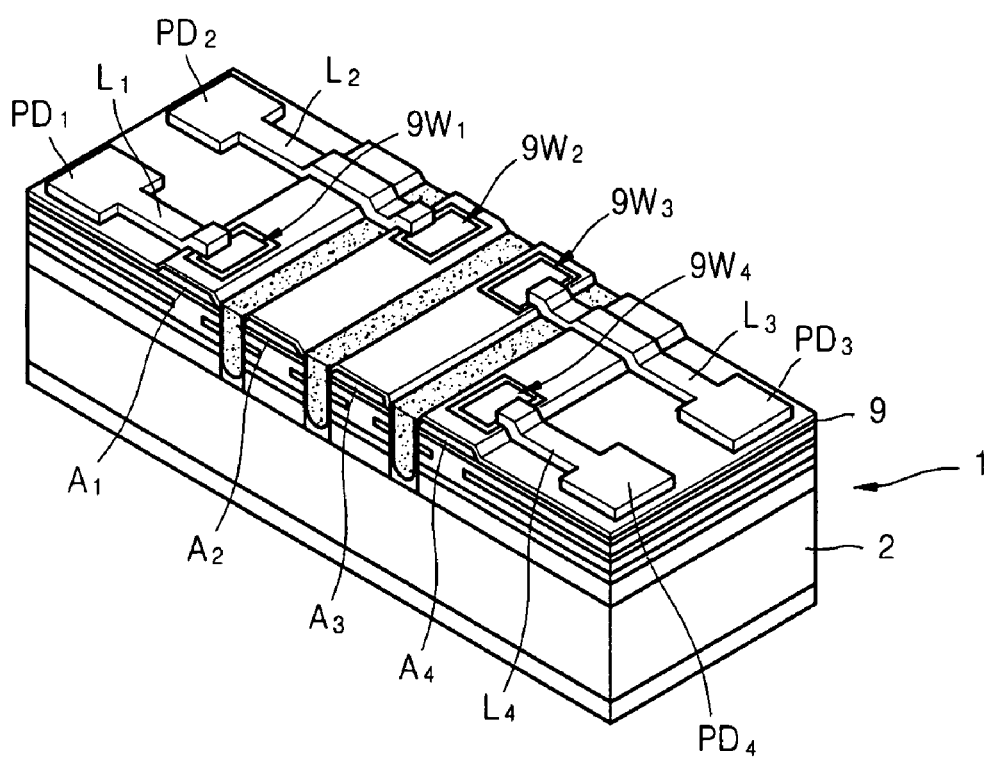
FIG. 1 is a diagram of a prior art multi-beam laser diode module.
Figure 2:
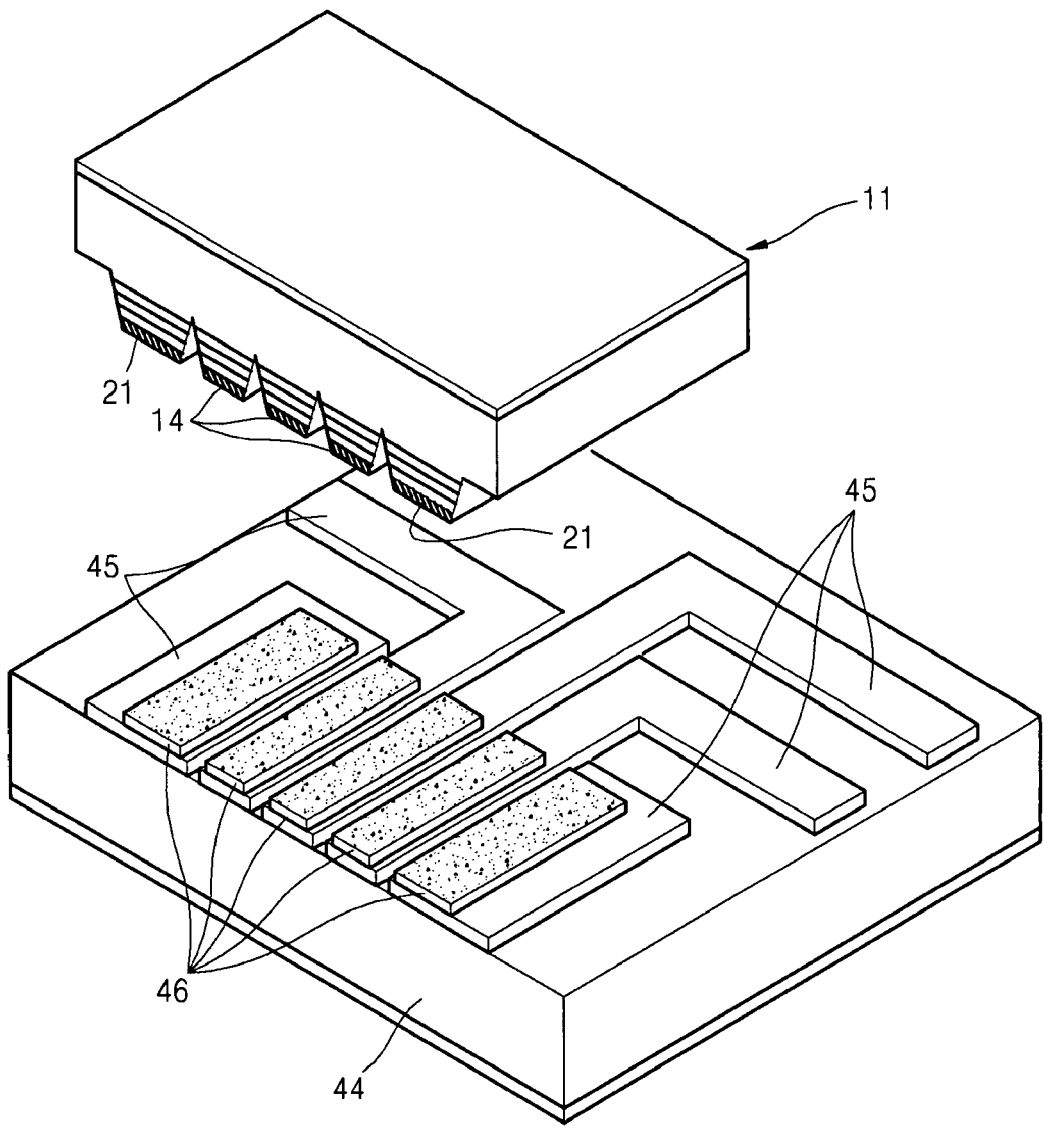
FIG. 2 is a diagram of a prior art multi-beam laser diode module.
Figure 3:
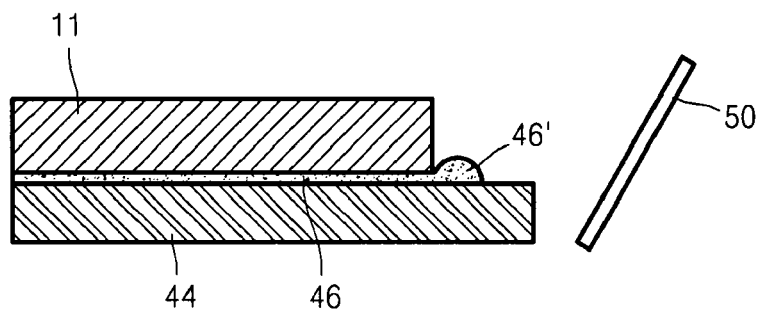
FIG. 3 is a side cross-sectional view showing a bonded laser diode and submount of FIG. 2.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
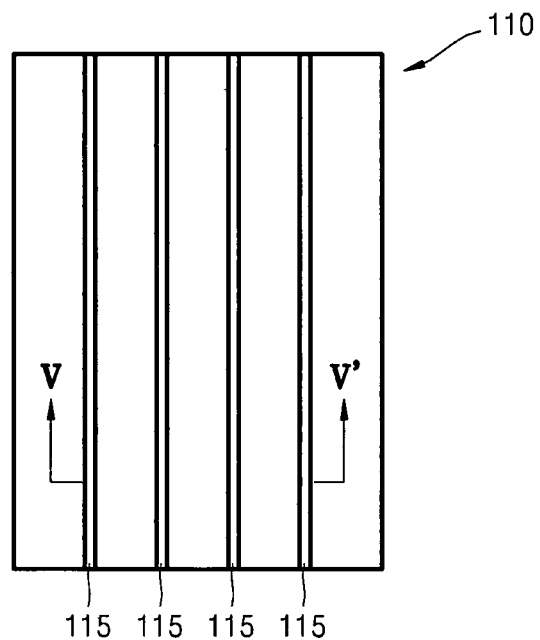
FIG. 4 is a plane view schematically illustrating an example embodiment multi-beam laser diode which may be flip-chip bonded to a submount.
Figure 5:
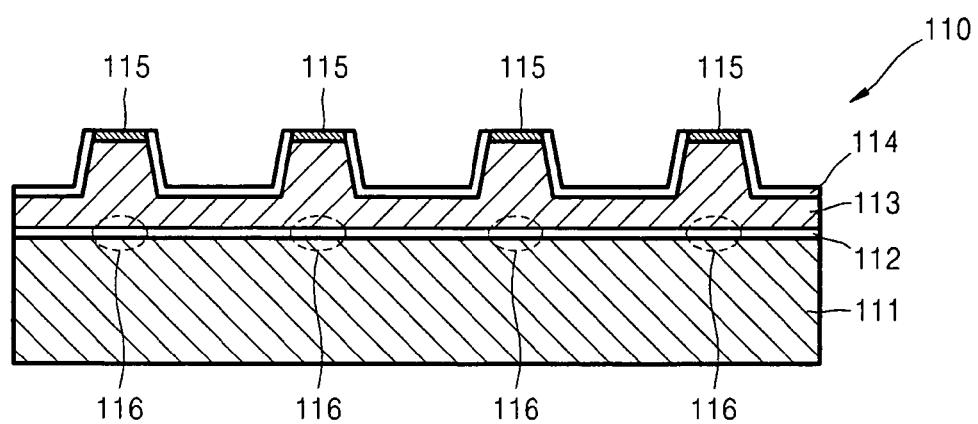
FIG. 5 is a cross-sectional view along line V-V' of the example embodiment multi-beam laser diode of FIG. 4.

FIG. 4 is a plane view schematically illustrating an example embodiment of a multi-beam laser diode 110 flip-chip bonded to a submount, and FIG. 5 is a cross-sectional view along line V-V' of the example embodiment multi-beam laser diode 110 of FIG. 4.

As shown in FIGS. 4 and 5, the multi-beam laser diode 110 may include a plurality of independently driven light emitting units 116. The multi-beam laser diode 110 may include sequentially laminated layers of a first compound semiconductor layer 111, an active layer 112, and/or a second compound semiconductor layer 113. The second compound semiconductor layer 113 may include a plurality of ridges on an upper surface along which electrodes 115 may be formed. The plurality of ridges may include any number of ridges. A protective layer 114 may be formed on the second compound semiconductor layer 113 between each of electrodes 115.

Figure 6:
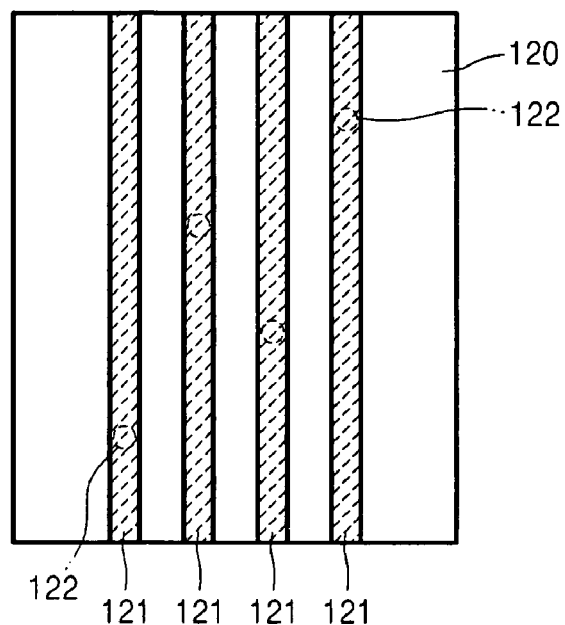
FIG. 6 is a plane view schematically illustrating an example embodiment first submount.
Figure 7:
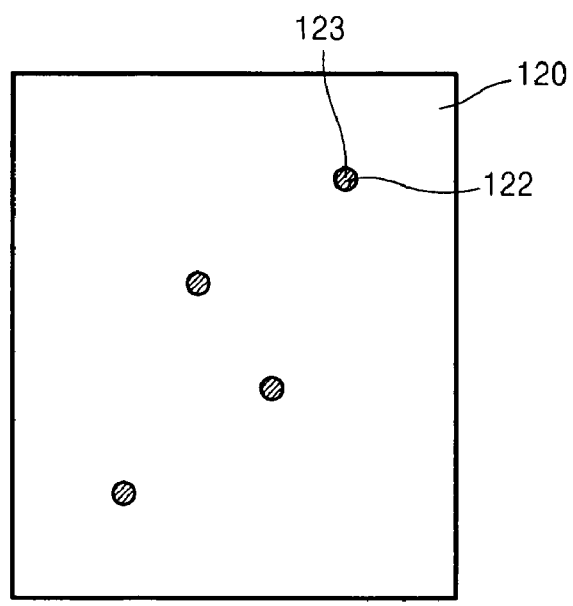
FIG. 7 is a bottom view of the example embodiment first submount of FIG. 6.
Figure 8:
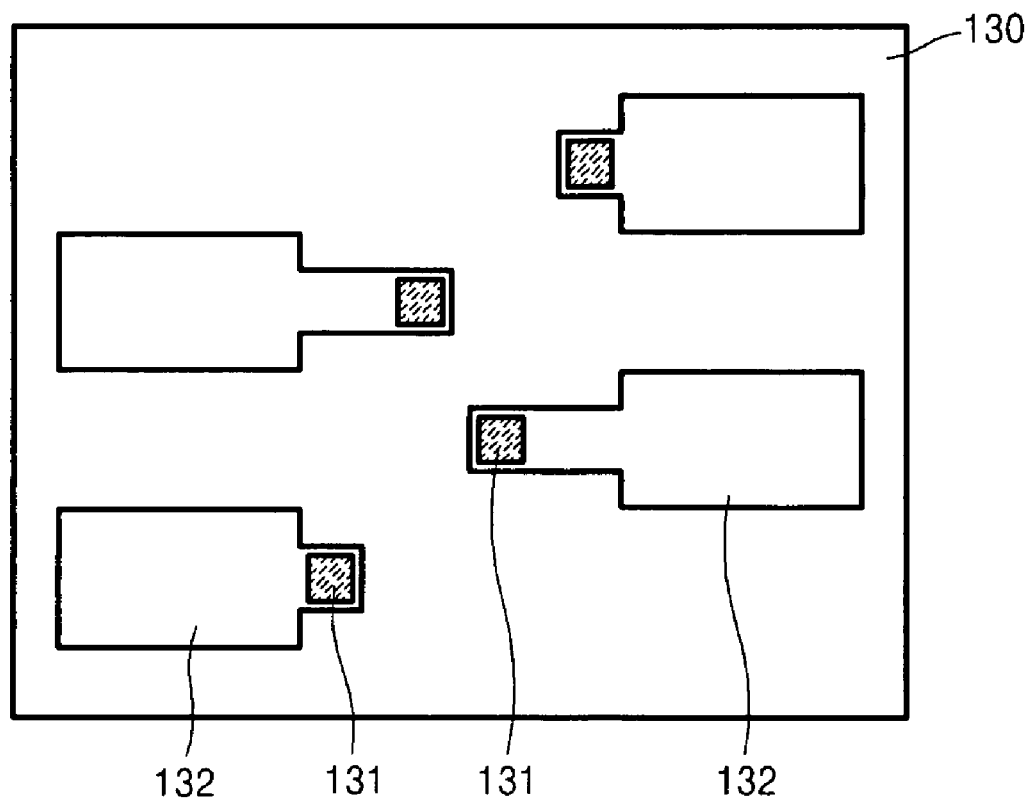
FIG. 8 is a plane view schematically illustrating an example embodiment second submount.

FIGS. 6 through 8 illustrate an example embodiment submount to which the example embodiment multi-beam laser diode 110 illustrated in FIGS. 4 and 5 may be flip-chip bonded. The example embodiment submount may include sequentially formed first and second submounts.

FIGS. 6 and 7 are a bottom view and a plane view, respectively, of the first submount.

As shown in FIGS. 6 and 7, the first submount may include a first substrate 120, a plurality of first solder layers 121 on the upper surface of the first substrate 120, and/or a plurality of via holes 122 penetrating the first substrate 120.

The first substrate 120 may be formed of insulating materials, for example, ceramic and/or any other insulating material. The first solder layers 121 may bond the electrodes 115 of the multi-beam laser diode 110 of FIG. 5 to the first submount. The first solder layers 121 may be formed on the first substrate 120 to the electrodes 115. The first solder layers 121 may be formed of conductive materials.

The first substrate 120 may include via holes 122 that penetrate the first substrate 120. The via holes 122 may be formed on the lower part of the first solder layers 121 to contact the first solder layers 121 and may be filled with conductive materials 123, for example, conductive metals. The first solder layers 121 may be electrically connected to the conductive materials 123 filled in the via holes 122 in the first substrate 120. The conductive materials 123 filled in the via holes 122 may be exposed on the lower surface of the first substrate 120. One via hole 122 may be formed to correspond to one first solder layer 121, or a plurality of via holes 122 may be formed to correspond to one first solder layer 121.

Figure 11:
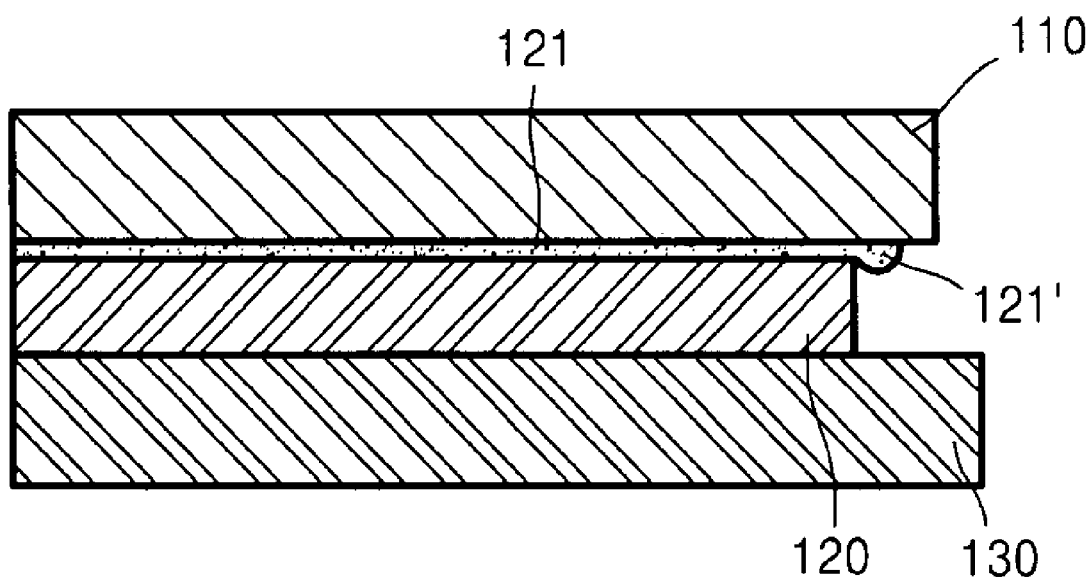
FIG. 11 is a side cross-sectional view schematically illustrating the example embodiment multi-beam laser diode module of FIG. 9.

In order to efficiently monitor laser light emitted to the rear of the multi-beam laser diode 110 of FIG. 11, the first submount may be shorter than the multi-beam laser diode 110 in a longitudinal direction of the first solder layers 121.

FIG. 8 is a plane view schematically illustrating the second submount. The second submount may be on a lower part of the first submount.

As shown in FIG. 8, the second submount may include a second substrate 130 on the lower part of the first substrate 120 and a plurality of bonding pads 132 corresponding to the number of electrodes 115 in the multi-beam laser diode 110. The bonding pads 132 may be formed on the second substrate 130. The second substrate 130 may be formed of insulating materials, for example, ceramic and/or any other insulating material. The bonding pads 132 may be formed on the second substrate 130 and may electrically connect to the conductive materials 123 that are filled in the via holes 122 of the first substrate 120. A second solder layer 131 may be formed between the conductive materials 123 and the bonding pads 132 and may bond the conductive materials 123 and the bonding pads 132 together. The second solder layer 131 may be formed of conductive materials that are similarly conductive as the first solder layers 121.

Figure 9:
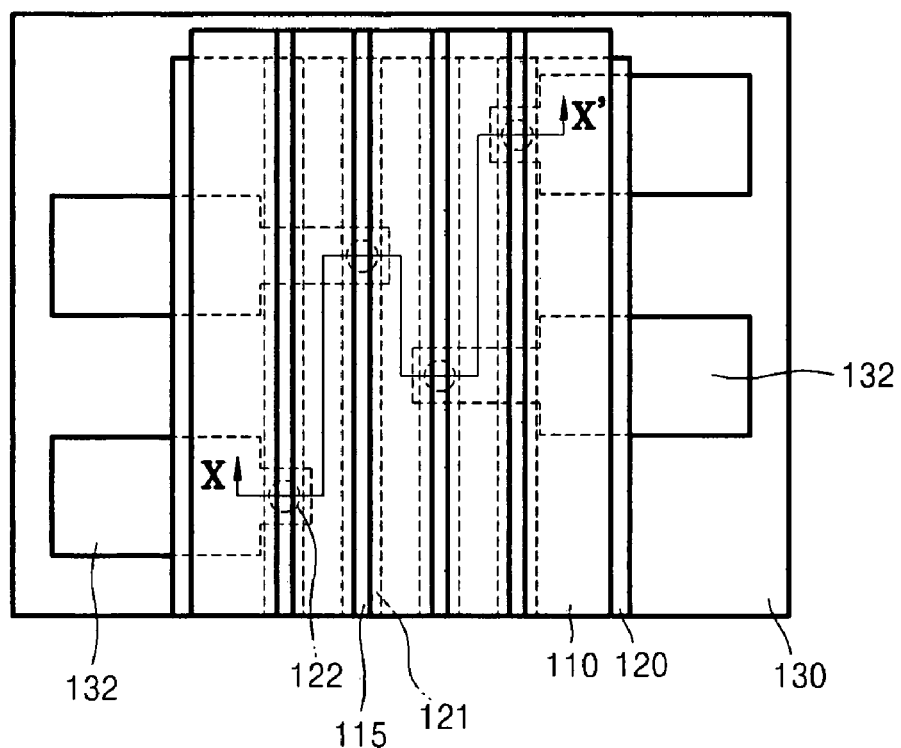
FIG. 9 is a plane view of an example embodiment multi-beam laser diode module created by flip-chip bonding a multi-beam laser diode to an example embodiment submount of any one of FIGS. 6 through 8.

FIG. 9 is a plane view of an example embodiment multi-beam laser diode module created by flip-chip bonding the multi-beam laser diode 110 of FIGS. 4 and 5 to the any of the first and second submounts of FIGS. 6 through 8, and FIG. 10 is a cross-sectional view along line X-X' of the example embodiment multi-beam laser diode module of FIG. 9.

Figure 10:
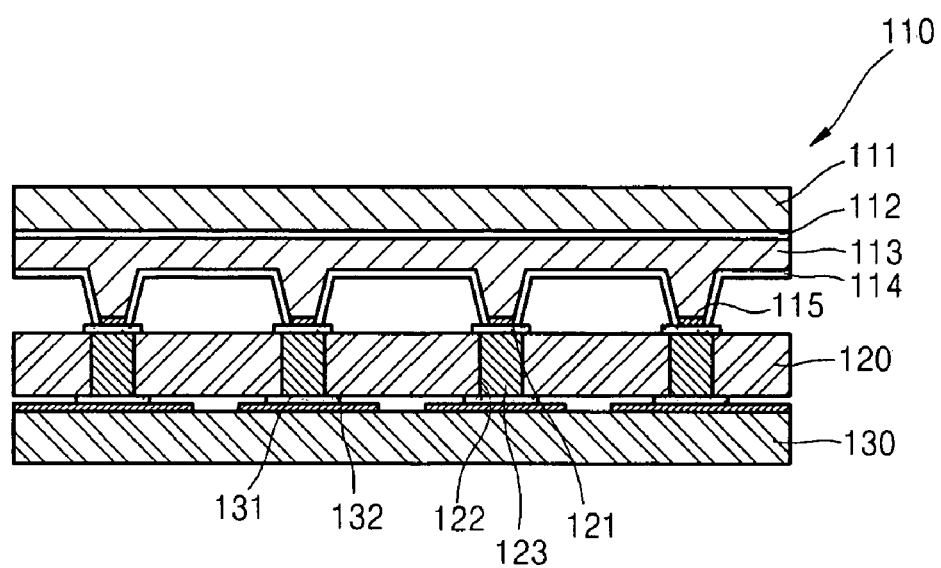
FIG. 10 is a cross-sectional view along line X-X' of the example embodiment multi-beam laser diode of FIG. 9.

As shown in FIGS. 9 and 10, the electrodes 115 of the multi-beam laser diode 110 may be bonded to the first solder layers 121 of a first submount. The first solder layers 121 may be electrically connected to the bonding pads 132 of the second submount through the conductive material 123, which may be filled in the via holes 122. A current may be supplied to the multi-beam laser diode module through each of the bonding pads 132 and may be transmitted to the electrodes 115 through the conductive materials 123 and the first solder layers 121. Each light emitting unit 116 of the multi-beam laser diode 110 may be independently driven.

FIG. 11 is a side cross-sectional view illustrating the example embodiment multi-beam laser diode module of FIGS. 9 and 10. As shown in FIG. 11, the first submount 120 may be shorter than the length of the multi-beam laser diode 110 in a longitudinal direction of the first solder layers 121. If the length of the first submount 120 is shorter than the length of the multi-beam laser diode 110, a solder "bump" 121' may be formed under the multi-beam laser diode 110 during bonding. Thus laser light emitted to the rear of the multi-beam laser diode 110 may not be obstructed by the solder bump 121' and may be efficiently monitored.

In the example embodiment multi-beam laser diode module, the bonding pads 132 for current injection may be separately formed from the multi-beam laser diode 110 and the chip size of the multi-beam laser diode 110 may be reduced. As a result, the number of multi-beam laser diodes 110 per wafer may be increased. Because complex wiring in the multi-beam laser diode 110 may not be required, the manufacturing process may be simplified and yield may be improved. The multi-beam laser diode 110 may be flip-chip bonded to the submount, and heat generated from each of the ridges of the multi-beam laser diode 110 may be directly transmitted to a heat sink (not illustrated) through the first and second submounts. This may prevent or reduce thermal cross-talk between adjacent ridges. Because the first submount to which the multi-beam laser diode 110 is bonded may be shorter than the length of the multi-beam laser diode 110, laser light emitted from the rear of the multi-beam laser diode 110 may be efficiently monitored.

Figure 12:
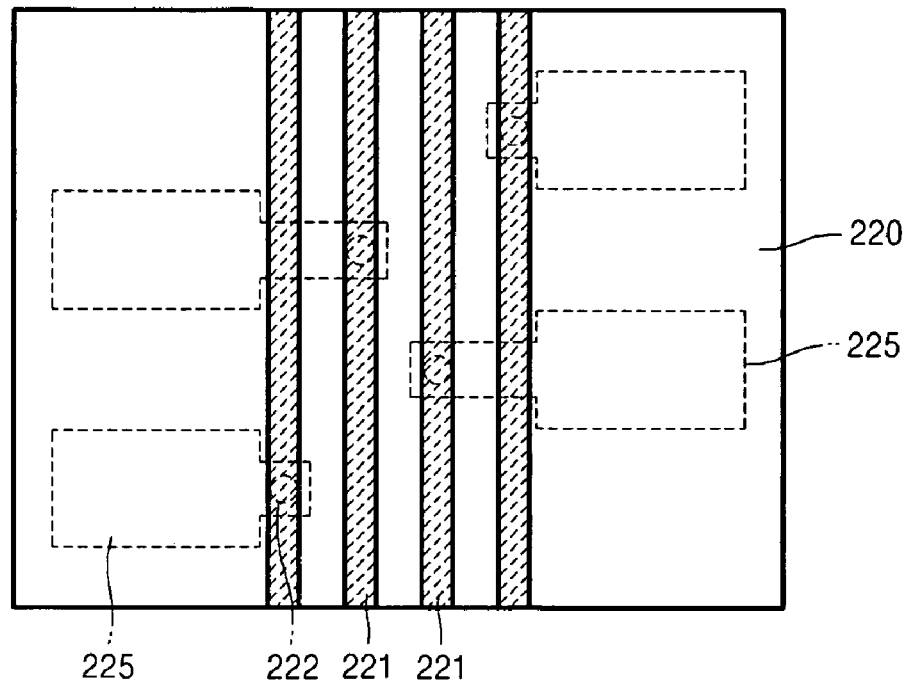
FIG. 12 is a plane view schematically illustrating an example embodiment submount.
Figure 13:
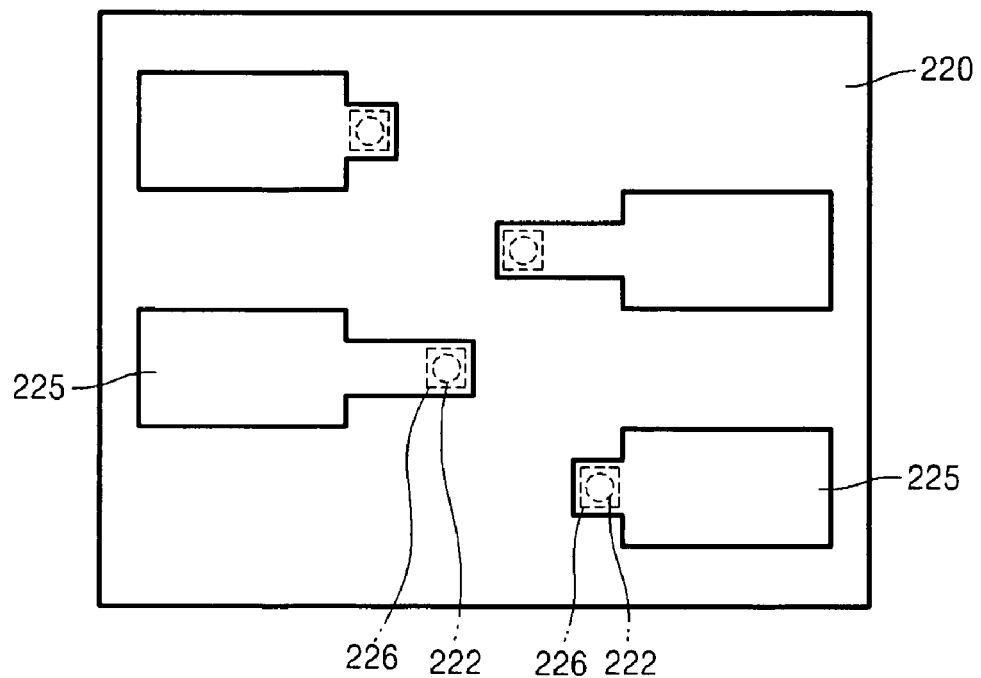
FIG. 13 is a bottom view of the example embodiment submount of FIG. 12.

FIG. 12 is a plane view schematically illustrating an example embodiment submount and FIG. 13 is a bottom view of the submount of FIG. 12.

The differences between the example embodiments described above and in FIGS. 12 and 13 are described herein.

As shown in FIGS. 12 and 13, the example embodiment submount may include a substrate 220, a plurality of first solder layers 221 formed on the upper surface of the first substrate 220, a plurality of via holes 222 penetrating the first substrate 220, and/or a plurality of bonding pads 225 on the lower surface of the first substrate 220.

The first substrate 220 may be formed of insulating materials, for example, ceramic and/or any other insulating materials. The first solder layers 221 may bond the electrodes 115 of the multi-beam laser diode 110 of FIG. 5 to a submount and may correspond to the electrodes 115. The first solder layers 221 may be formed of electrically conductive materials.

The first substrate 220 may include via holes 222 on which the first solder layers 221 are formed. The via holes 222 may be formed on the lower part of the first solder layers 221 and may be filled with conductive materials 223, for example, conductive metals and the like. The first solder layers 221 may be electrically connected to the conductive materials 223 filled in the via holes 222 in the first substrate 220. One via hole 222 or a plurality of via holes may correspond to one first solder layer 221.

A plurality of bonding pads 225 corresponding to the number of electrodes 115 of the multi-beam laser diode 110 may be formed on the lower surface of the first substrate 220. The bonding pads 225 may electrically connect to the conductive materials 223, which may be filled in the via holes 222. A second solder layer 226 may be formed between the conductive materials 223 and the bonding pads 225 to bond the conductive materials 223 and the bonding pads 225 together. The second solder layer 226 may be formed of electrically conductive materials, similar to the first solder layers 221.

The submount may be shorter than the multi-beam laser diode 110 in a longitudinal direction of the first solder layers 221 in order to efficiently monitor laser light emitted to the rear of the multi-beam laser diode 110 of FIG. 11.

Figure 14:
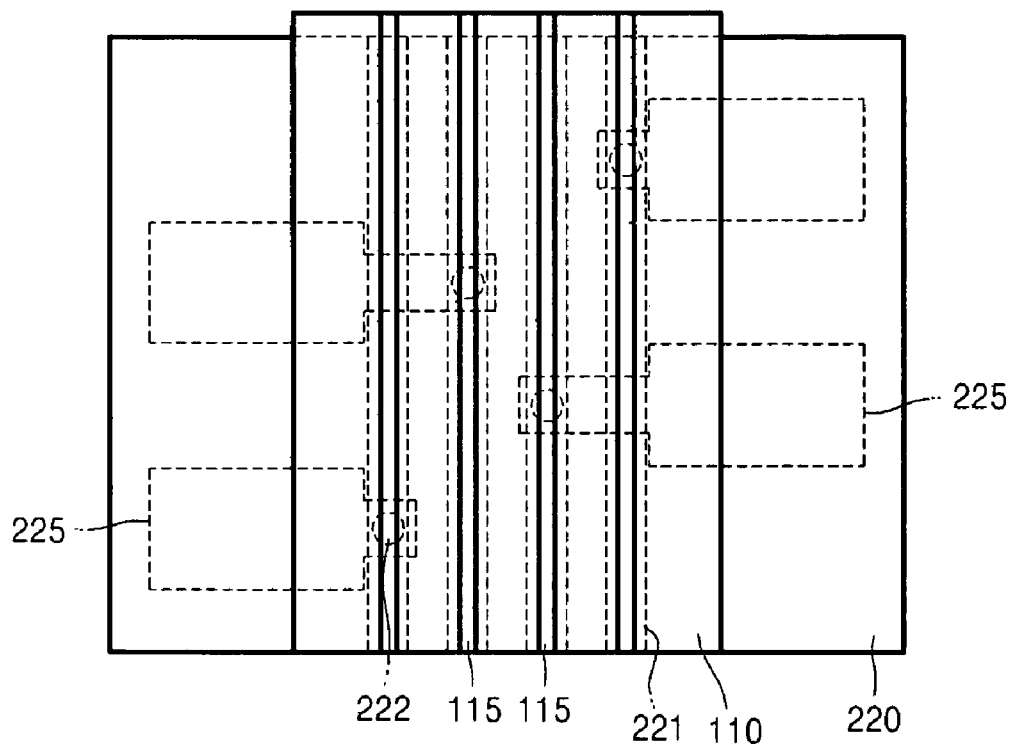
FIG. 14 is a plane view of an example embodiment multi-beam laser diode module created by flip-chip bonding a multi-beam laser diode to the example embodiment submount of FIGS. 12 and 13.
Figure 15:
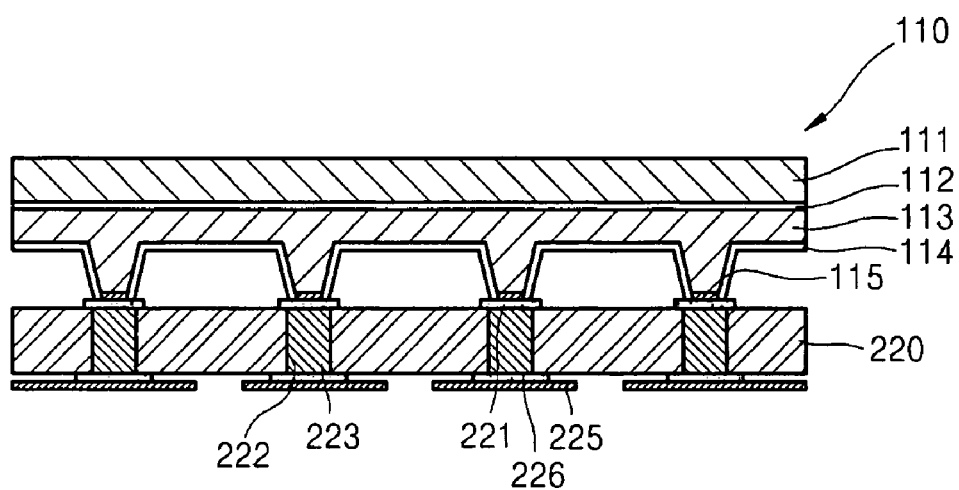
FIG. 15 is a cross-sectional view of the example embodiment multi-beam laser diode module of FIG. 14.

FIG. 14 is a plane view of an example embodiment multi-beam laser diode module created by flip-chip bonding the multi-beam laser diode of FIGS. 4 and 5 to the submount of FIGS. 12 and 13, and FIG. 15 is a cross-sectional view of the example embodiment multi-beam laser diode module of FIG. 14.

As shown in FIGS. 14 and 15, the electrodes 115 of the multi-beam laser diode 110 may be bonded to the first solder layers 221 formed on the upper surface of the substrate 220. The first solder layers 221 may be electrically connected to the bonding pads 225 on the lower surface of the substrate 220 through the conductive materials 223 which may be filled in the via holes 222. A current may be supplied to the multi-beam laser diode module through each of the bonding pads 225 and may be transmitted to the electrodes 115 through the conductive materials 223 and the first solder layers 221. Each light emitting unit 116 of the multi-beam laser diode 110 may thus be independently driven.

In an example embodiment multi-beam laser diode module, the number of multi-beam laser diodes 110 per wafer may be increased. A diode manufacturing process may be simplified and yield may be improved. Heat generated from each of the ridges in the multi-beam laser diode 110 may be directly transferred to a heat sink (not illustrated) via a submount, and thermal cross-talk may be prevented or reduced between adjacent ridges. Because the length of a submount may be less than the length of the multi-beam laser diode 110, laser light emitted from the rear of the multi-beam laser diode 110 may be efficiently monitored.

Figure 16:
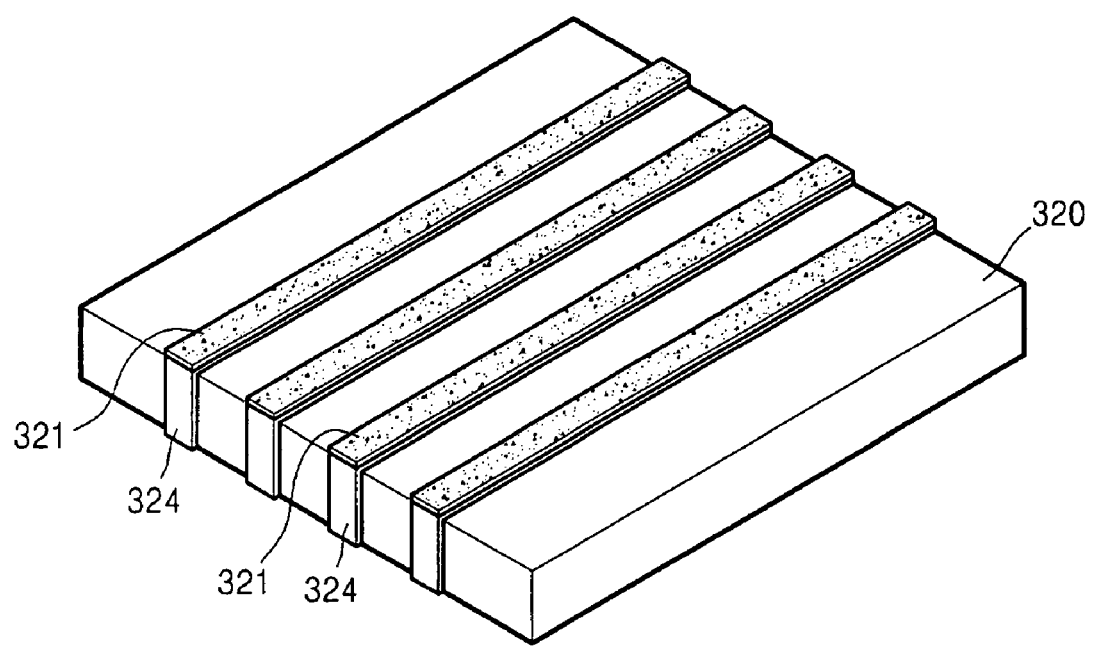
FIG. 16 is a perspective view of an example embodiment submount.
Figure 17:
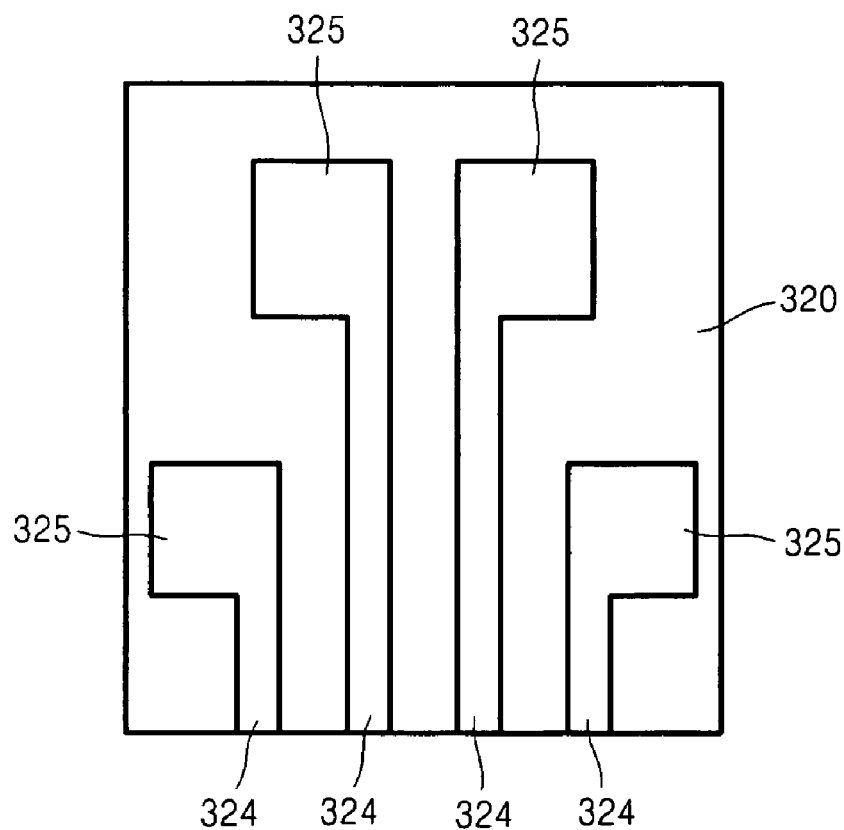
FIG. 17 is a bottom view of the example embodiment submount of FIG. 16.

FIG. 16 is a perspective view of an example embodiment submount, and FIG. 17 is a bottom view of the example embodiment submount of FIG. 16.

As shown in FIGS. 16 and 17, the example embodiment submount may include a substrate 320, a plurality of conductive layers 324 formed on the substrate 320 extending along the side of the substrate 320 to the lower surface of the substrate 320, a plurality of solder layers 321 formed on the conductive layers 324, and/or a plurality of bonding pads 325 formed on the lower surface of the substrate 320.

The substrate 320 may be formed of insulating materials, for example ceramic and/or any other insulating materials. Rows of conductive layers 324 may correspond to the number of electrodes 115 of the multi-beam laser diode 110 of FIG. 5. Conductive layers 324 may be formed of conductive materials. The solder layers 321 may be formed on the conductive layers 324, and the conductive layers 324 may be formed on the substrate 320. The solder layers 321 may bond the electrodes 115 of the multi-beam laser diode 110 of FIG. 5 to the submount and may correspond to the electrodes 115. The solder layers 321 may be formed of electrically conductive materials. The bonding pads 325 may be formed on the lower surface of the substrate 320 and may be electrically connected to the conductive layers 324 on the lower surface of the substrate 320.

The length of the submount may be shorter than the length of the multi-beam laser diode 110 in a longitudinal direction of the solder layers 321 to efficiently monitor laser light emitted to the rear of the multi-beam laser diode 110 of FIG. 5.

Figure 18:
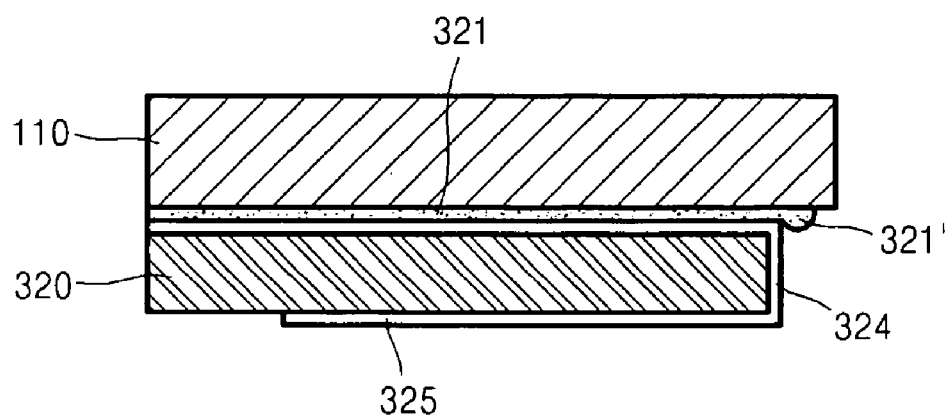
FIG. 18 is a side cross-sectional view schematically illustrating an example embodiment multi-beam laser diode module created by flip-chip bonding a multi-beam laser diode to the example embodiment submount of FIGS. 16 and 17.

A submount and the multi-beam laser diode 110 of FIGS. 4 and 5 may be flip-chip bonded to form a multi-beam laser diode module. FIG. 18 is a side cross-sectional view illustrating a multi-beam laser diode module that may be created by flip-chip bonding the multi-beam laser diode 110 to the submount of any one of FIGS. 16 and 17.

As shown in FIG. 18, the electrodes 115 of the multi-beam laser diode 110 may be bonded to the solder layers 321 of the submount. A current may be supplied to the multi-beam laser diode module through each of the bonding pads 325 and may be transmitted to the electrodes 115 through the conductive layers 324 and the solder layers 321. Each light emitting unit 116 of the multi-beam laser diode 110 may thus be independently driven.

In an example embodiment multi-beam laser diode module, the bonding pads 325 may be formed separately from the multi-beam laser diode 110, and the chip size of the multi-beam laser diode 110 may be reduced. The number of multi-beam laser diodes 110 per wafer may be increased. Because complex wiring in the laser diode 110 may not be required, the manufacturing process may be simplified and yield may be improved. Heat generated from each of the ridges of the multi-beam laser diode 110 may be directly transmitted to a heat sink (not illustrated) via the submount. Thermal cross-talk may be reduced or prevented between adjacent ridges. As shown in FIG. 18, because the length of the submount may be less than the length of the multi-beam laser diode 110, a solder bump 321' may form under the multi-beam laser diode 110 when the electrodes 115 are bonded to the solder layers 321 of the submount. Thus, laser light emitted from the rear of the multi-beam laser diode 110 may be efficiently monitored.

Figure 19:
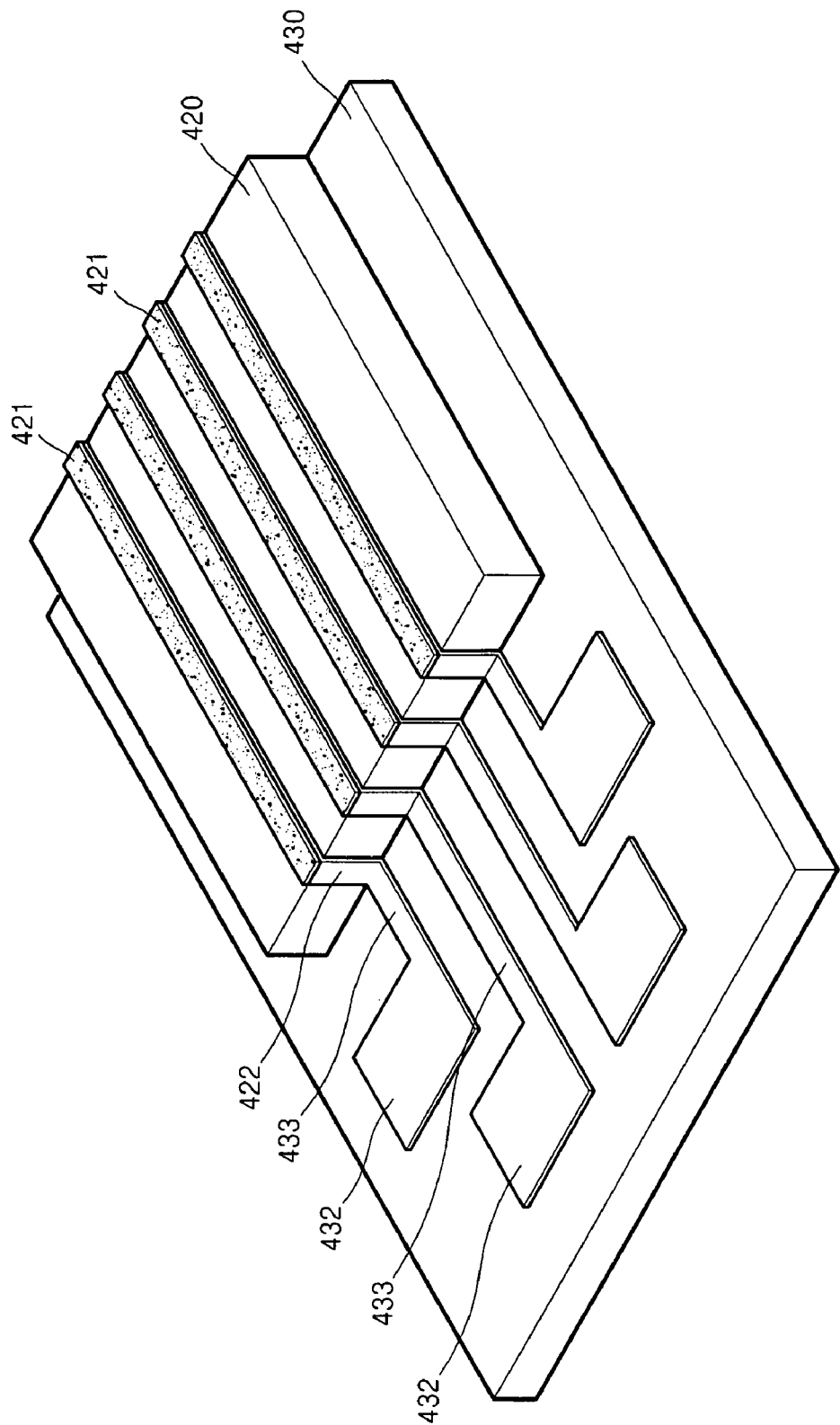
FIG. 19 is a perspective view of an example embodiment submount.

FIG. 19 is a perspective view of an example embodiment submount.

As shown in FIG. 19, the example embodiment submount may be formed of a first submount and a second submount under the first submount. The first submount may include a substrate 420, a plurality of first conductive layers 422 formed along the upper surface of the first substrate 420 extending along the side of the first substrate 420 and a plurality of solder layers 421 formed on the first conductive layers 422. The second submount may include a second substrate 430 disposed under the first substrate 420 and a plurality of bonding pads 432 corresponding to the number of electrodes 115 of the multi-beam laser diode 110 of FIG. 5 on the second substrate 430. The first and second substrates 420 and 430 may be formed of insulating materials, for example, ceramic and/or another insulating material.

The first conductive layers 422 may form rows to correspond to the electrodes 115 of the multi-beam laser diode 110 of FIG. 5. The first conductive layers 422 may be formed of electrically conductive materials. The solder layers 421 may be formed on the first conductive layers 422, wherein the first conductive layers 422 may be formed on the first substrate 420. The solder layers 421 may bond the electrodes 115 of the multi-beam laser diode 110 to the first submount and may be formed forming a row corresponding to the electrodes 115. The solder layers 421 may be formed of electrically conductive materials.

The length of the first submount may be less than the length of the multi-beam laser diode 110 in a longitudinal direction of the solder layers 421 to efficiently monitor laser light emitted to the rear of the multi-beam laser diode 110 of FIG. 11.

The bonding pads 432 may be formed to electrically connect to the first conductive layers 422 formed on the second substrate 430. Second conductive layers 433 may be formed on the second substrate 430 to electrically connect the first conductive layers 422 on the side of the first substrate 420 to the bonding pads 432. Solder layers (not illustrated) may be formed between the first conductive layers 422 and the second conductive layers 433 to bond them together.

Figure 20:
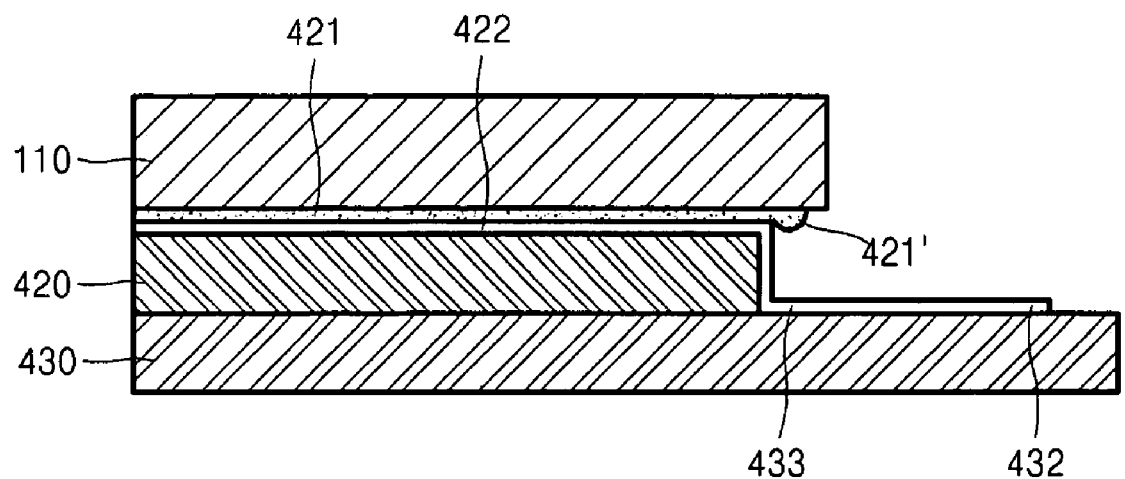
FIG. 20 is a side cross-sectional view schematically illustrating an example embodiment multi-beam laser diode module created by flip-chip bonding a multi-beam laser diode to the example embodiment submount of FIG. 19.

A multi-beam laser diode module may be manufactured if the submount described above and the multi-beam laser diode 110 of FIGS. 4 and 5 are flip-chip bonded. FIG. 20 is a side cross-sectional view schematically illustrating the example embodiment multi-beam laser diode module manufactured by flip-chip bonding the multi-beam laser diode 110 to the submount of FIG. 19

As shown in FIG. 20, the electrodes 115 of the multi-beam laser diode 110 may be bonded to the solder layers 421 of the first submount. A current may be supplied to the multi-beam laser diode module through each of the bonding pads 432 and may be transmitted to the electrodes 115 through the second conductive layers 433, the first conductive layers 422, and/or the solder layers 421. Each light emitting unit 116 of the multi-beam laser diode 110 may thus be independently driven.

Because the bonding pads 432 are separately formed from the multi-beam laser diode 110, the chip size of the multi-beam laser diode 110 may be reduced.

Because the chip size of the multi-beam laser diode 110 may be reduced, the number of multi-beam laser diodes 110 per wafer may be increased. Because complex wiring in the laser diode 110 may not be required, a manufacturing process may be simplified and yield may be improved. Heat generated from each of the ridges of the multi-beam laser diode 110 may be directly transmitted to a heat sink (not illustrated) via the first and second submounts, and thermal cross-talk may not occur between adjacent ridges. As illustrated in FIG. 20, because the length of the first submount may be less than the length of the multi-beam laser diode 110, laser light emitted from the rear of the multi-beam laser diode 110 may be efficiently monitored.

Bonding pads formed on the submount and used to supply a current may be separately formed from the multi-beam laser diode, and chip size of the multi-beam laser diode may be reduced. The number of multi-beam laser diode chips per wafer may be increased. Because complex wiring in the laser diode may not be required, the manufacturing process may be simplified and yield may be improved.

The multi-beam laser diode may be flip-chip bonded to the submount, and heat generated from each of the ridges of the multi-beam laser diode may be directly transmitted to a heat sink via the submount. Thermal cross-talk may be reduced or prevented between adjacent ridges.

The length of the submount that is bonded to the multi-beam laser diode may be less than the length of the multi-beam laser diode. Laser light emitted from the rear of the multi-beam laser diode may thus be efficiently monitored.

While example embodiments have been particularly shown and described, it will be understood by those of ordinary skill in the art that various changes in form and details may be made therein without departing from the spirit and scope of the present invention as defined by the following claims.

What is claimed is:

1. A submount structure that is flip-chip bonded to a multi-beam laser diode having a plurality of independently driven light emitting units, the submount structure comprising:
   a first submount including a first substrate and a plurality of first solder layers on the first substrate, wherein the first submount is shorter than the multi-beam laser diode in a longitudinal direction of the first solder layers; and a second submount including a second substrate under the first substrate and a plurality of bonding pads on the second substrate.

2. The submount structure of claim 1, wherein the multi-beam laser diode includes a plurality of electrodes that are bonded to the first solder layers and correspond to of the plurality of first solder layers.

3. The submount structure of claim 1, wherein the first submount includes a plurality of via holes penetrating the first substrate.

4. The submount structure of claim 3, wherein the plurality of via holes are filled with conductive materials and are electrically connected to the first solder layers.

5. The submount structure of claim 4, further comprising:
a plurality of electrodes on the second substrate that electrically connect the plurality of bonding pads to the conductive materials filled in the via holes, wherein each of the bonding pads correspond to each of the electrodes.

6. The submount structure of claim 3, further comprising:
a second solder layer between the bonding pads and the conductive materials filled in the via holes.

7. The submount structure of claim 6, wherein the first and second solder layers and the conductive materials are formed of metals.

8. The submount structure of claim 3, wherein at least one via hole corresponds to each of the first solder layers.

9. The submount structure of claim 1, wherein the first solder layers are in rows.

10. The submount structure of claim 1, further comprising:
a plurality of ridges on the multi-beam laser diode; and
a plurality of electrodes that are bonded to the first solder layers and correspond to the first solder layers formed in rows on the ridges.

11. The submount structure of claim 10, wherein the first solder layers are in rows to correspond to the electrodes.

12. The submount structure of claim 1, wherein the first submount includes a plurality of first conductive layers extending on the upper surface of the first substrate corresponding to electrodes of the multi-beam laser diode and is electrically connected to the plurality of bonding pads, and wherein the plurality of solder layers are on the first conductive layers.

13. The submount structure of claim 12, further comprising:
second conductive layers on the second substrate electrically connected to the first conductive layers and the bonding pads.

14. The submount structure of claim 13, wherein the first and second conductive layers and solder layers are formed of metals.

15. The submount structure of claim 12, wherein the first conductive layers and the solder layers are in rows.

16. The submount structure of claim 12, further comprising:
a plurality of ridges on which the electrodes are in rows.

17. The submount structure of claim 16, wherein the first conductive layers and the solder layers are in rows corresponding to the electrodes.

18. A submount that is flip-chip bonded to a multi-beam laser diode having a plurality of independently driven light emitting units, the submount comprising:
a substrate;
a plurality of first solder layers formed on an upper surface of the substrate corresponding to electrodes of the multi-beam laser diode, wherein the electrodes are bonded to the first solder layers; and
a plurality of bonding pads corresponding to the number of electrodes formed on a lower surface of the substrate.

19. The submount of claim 18, wherein the first solder layers are in rows.

20. The submount of claim 18, wherein a plurality of via holes penetrate the substrate, the plurality of holes being filled with conductive materials electrically connected to the first solder layers and the plurality of bonding pads.

21. The submount of claim 20, further comprising:
a second solder layer between the bonding pads and the conductive materials filled in the via holes.

22. The submount of claim 21, wherein the first and second solder layers and the conductive materials are formed of metals.

23. The submount of claim 20, wherein at least one via hole is formed to correspond to each of the first solder layers.

24. The submount of claim 18, wherein the submount is shorter than the multi-beam laser diode in a longitudinal direction of the first solder layers.

25. The submount of claim 18, further comprising:
a plurality of ridges on the multi-beam laser diode; and
a plurality of electrodes that are bonded to the first solder layers and correspond to the first solder layers in rows on the ridges.

26. The submount of claim 25, wherein the first solder layers are formed in rows to correspond to the electrodes.

27. The submount of claim 18, further comprising:
a plurality of conductive layers extending along a side of the substrate to the lower surface of the substrate and corresponding to electrodes of the multi-beam laser diode and electrically connected to the conductive layers.

28. The submount of claim 27, wherein the conductive layers and the solder layers are in rows.

29. The submount of claim 27, wherein the conductive layers and solder layers are formed of metals.

30. The submount of claim 27, wherein the submount is shorter than the multi-beam laser diode in a longitudinal direction of the solder layers.

31. The submount of claim 27, further comprising:
a plurality of ridges on the multi-beam laser diode; and
a plurality of electrodes that are bonded to the first solder layers and correspond to of the plurality of first solder layers formed in rows on the ridges.

32. The submount of claim 31, wherein the conductive layers and the solder layers are formed in rows corresponding to the electrodes.

* * * * *